Nov. 4, 1969 CHANG K. CHU 3,476,992

GEOMETRY OF SHORTED-CATHODE-EMITTER FOR LOW AND HIGH POWER THYRISTOR

Filed Dec. 26, 1967

WITNESSES:

Leon M. Garman

Donald M. Winegar

INVENTOR

Chang K. Chu

BY

C. L. Menzemer

ATTORNEY

United States Patent Office 3,476,992

Patented Nov. 4, 1969

3,476,992

GEOMETRY OF SHORTED-CATHODE-EMITTER FOR LOW AND HIGH POWER THYRISTOR

Chang K. Chu, Pittsburgh, Pa., assignor to Westinghouse Electric Corporation, Pittsburgh, Pa., a corporation of Pennsylvania Filed Dec. 26, 1967, Ser. No. 693,454

Int. Cl. H01l *11/00, 3/00, 5/00*

U.S. Cl. 317—235 5 Claims

ABSTRACT OF THE DISCLOSURE

A design of a shorted-cathode-emitter for low and high power thyristors has a total shunt area of less than 20 pecent of the cathode area. No shunt is located less than 15 mils from the inner periphery of the cathode, and each shunt is at least 10 mils apart from each other.

BACKGROUND OF THE INVENTION

Field of the invention

This invention relates to electrical contacts for semiconductor devices and in particular to a shorted-cathode-emitter design for low and high power thyristors.

Description of the prior art

Prior art shorted-cathode-emitter shunts in either diffused, alloyed, or alloyed-diffused low and high power thyristors begin at the cathode edge nearest the gate and are uniformly distributed throughout the entire cathode area. The resulting configuration enables one to achieve a high rate of rise of forward blocking voltage as well as a high turn-on time and a higher dynamic forward voltage drop. However, it has been found that indiscriminate shunting of the p-n junction between the first emitter region and the first base region results often in undesirable functional characteristics of the devices. One of these undesirable functional characteristics is the high initial heat generated by prior art devices, as illustrated graphically by the charatceristic loop effect which occurs in the forward I–V characteristic curve.

SUMMARY OF THE INVENTION

In accordance with the techings of this invention there is provided a semiconductor controlled rectifier comprising four semiconductor regions arranged in succession of which contiguous regions are of opposite semiconductivity type, the regions comprising a first emitter region having a major surface, a first base region, a second base region, and a second emitter region; a p-n junction between each pair of contiguous regions of the alternate semiconductivity type; a first means to make electrical contact to the first base region; means to short the p-n junction between the first emitter region and the first base region, the means being located at a distance greater than 15 mils from the periphery of the first emitter region closest to the first means of electrical contacting; a second means to make simultaneous electrical contact to the first emitter region and the means to short the p-n junction between the first emitter region and the first base region; and a third means to make electrical contact to the second emitter region.

An object of this invention is to reduce the initial surge of heat which is generated by a shorted-emitter-cathode semiconductor controlled rectifier when it is turned on.

An object of this invention is to reduce the loop effect in the forward I–V characteristic curve of a semiconductor controlled rectifier having a shorted-emitter-cathode.

Another object of this invention is to produce a semiconductor controlled rectifier having a shorted-emitter-cathode in which the turn-on time and the rate of rise of forward blocking voltages is less than prior art devices.

Other objects of this invention will, of course, be obvious and will, of course, appear hereinafter.

DRAWINGS

In order to better understand the nature and objects of this invention, one should note the detailed drawings in which.

DESCRIPTION OF THE INVENTION

Figures 1, 2, 3, 6:
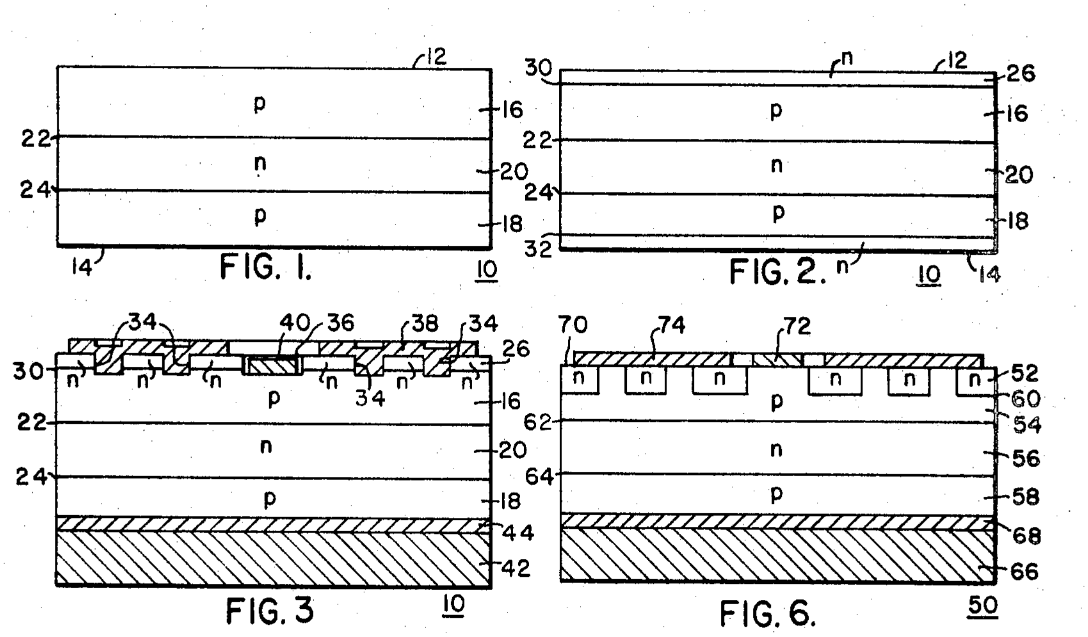
FIGURES 1 and 2 are elevation views, in cross-section of a body of semiconductor material being processed in accordance with the teachings of this invention.
FIG. 3 is an elevation view, partly in cross-section, of the body of semiconductor material of FIG. 4, taken along the cutting plane III—III.
FIG. 6 is an elevation view, partly in cross-section, of a body of semiconductor material processed in accordance with an alternate teaching of this invention.

Referring to FIG. 1, there is shown a body 10 of semiconductor material. The body 10 may comprise any semiconductor material. However, in order to explain the invention more fully, and for no other reason, the body 10 will be described as comprising n-type silicon having a substantially uniform resistivity of from 25 to 35 ohm-centimeter. The body 10 has a top surface 12 and a bottom surface 14.

Employing suitable means known to those skilled in the art, such, for example, as a double diffusion process utilizing aluminum or gallium as a suitable impurity material, two regions 16 and 18 of p-type semiconductivity are formed in the body 10 and comprise the top surface 12 and the bottom surface 14 respectively. The remainder of the original material comprising the body 10 comprises a region 20 of n-type semiconductivity. The coextensive surfaces of regions 16 and 18 with region 20 form respective p-n junctions 22 and 24.

With reference to FIG. 2 a simultaneous double diffusion process employing a suitable n-type dopant material such, for example, as phosphorus, forms regions 26 and 28 of n-type semiconductivity in regions 16 and 18 respectively. The n-type regions 26 and 28 comprise, respectively, the top surface 12 and the bottom surface 14. The coextensive surfaces of the opposite type semiconductivity regions 16 and 26 and 18 and 28 form respective p-n junctions 30 and 32.

With reference now to FIG. 3 a plurality of spaced apertures 34 are formed in a selected portion of the region 26 along with an opening 36 for the affixing of a gate contact to the region 16. Employing suitable processes well known to those skilled in the art, such, for example, as photolithographic techniques followed by selective chemical etching the apertures 34 and the opening 36 are formed to extend completely through the region 26 to a depth slightly the p-n junction 30.

Figure 4:
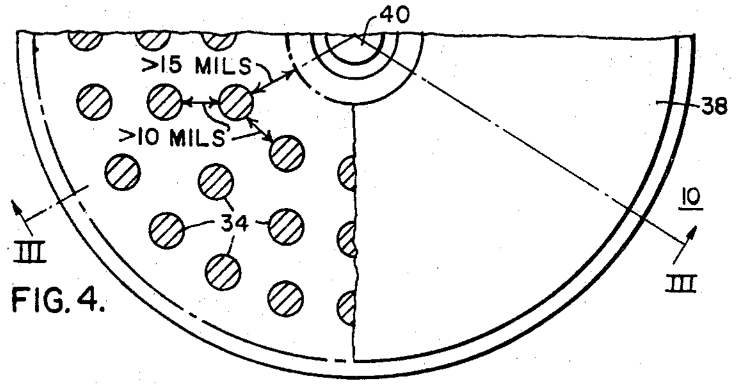
FIG. 4 is a planar view, partly sectionalized, of the body of semiconductor material of FIG. 3.

The pattern of the apertures 34 has a definite predetermined geometry. As shown in FIGURE 4 each aperture 34 is designed to be at least 15 mils in distance from the inner edge of an emitter contact which is to be closest to a gate contact, each of the contacts being subsequently affixed to respective regions of the body 10. Each aperture 34 is in turn greater than 10 mils in distance from the next adjacent apertures 34. The total surface area of the apertures 34 affixed to the subsequently affixed emitter contact is always less than 20 percent of the surface area of the region 26 affixed to the emitter contact.

A first electrical contact 38 is affixed to selected portions of both of the regions 16 and 26 by preferably vaporizing the suitable material such, for example, as aluminum onto the regions 16 and 26. In a like manner a second electrical contact 40 is affixed to a portion of the region 16 exposed within the opening 36. A third electrical contact 42 comprising an alloyed ohmic contact is joined to the body 10 by forming a crystallized p-region 44 with the metal contact 42 of electrically conductive metal fused thereto.

The four successive regions 26, 16, 20, and 18 are referred to in the art as the first emitter region 26, the first base region 16, the second base region 20, and the second emitter region 18. The n-type outer region 26 is also sometimes referred to as the cathode and the p-type outer region 18 is sometimes referred to as the anode.

The first electrical contact 38 is the first emitter contact and it shorts the p-n junction 30 in a plurality of places via the previously formed apertures 34 in the region 26. The second electrical contact 40 is a gate contact and the third electrical contact is the anode contact.

Evaluation of semiconductor devices embodying the body 10 of FIG. 3 made in accordance with the teachings of this invention show that the *dv/dt*, or rate of rise of forward blocking voltage, is affected not only by the shorted emitter area, but also is dependent upon the shunt pattern. FIG. 4 is illustrative of the preferred geometrical pattern. It is to be noted of course that the apertures, the emitter region, and the gate region may have any other geometrical pattern. Additionally it is to be noted of course that the apertures, the emitter region, and the gate region also may have any other geometrical shape.

Figure 5:
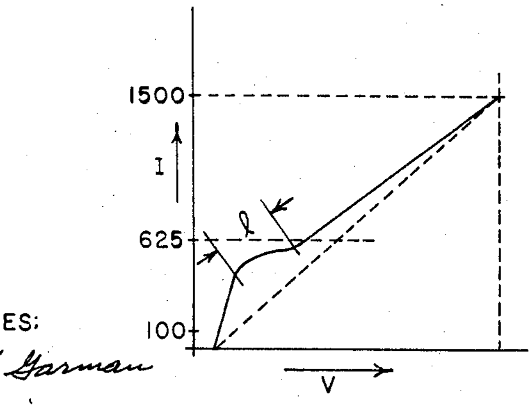
FIG. 5 is a graphical plot of the forward I–V characteristic of the processed body of semiconductor material of FIG. 3.

The requirement that apertures 34, and consequently electrical shunts between the emitter contact 38 and the region 16, be located greater than 15 mils from the inner periphery of the emitter region 26 enables one to reduce the loop effect, *l*, in the forward I–V characteristic curve of FIG. 5 for the geometrical pattern of FIG. 4. The loop effect, *l*, is virtually eliminated by leaving out some of the electrical shunts immediately adjacent to the gate contact 40 as shown by the preferred geometry.

It is known that a thyristor starts to turn on in the emitter region 26 next to the gate contact 40 and then the turned-on region spreads toward the outer periphery of the region 26. The turn-on time is dependent on the spreading velocity. Therefore, the hinderance encountered by way of the shunts, or apertures 34, increases the turn-on time. The hinderance of the shunts is also the probable cause of the loop effect in the forward I–V characteristic.

The rate of rise of forward current, *di/dt*, that can be withstood by the body 10 is also dependent on the spreading velocity. A low spreading velocity causes high power dissipation during the initial stages of turn-on. During the turn-on, the forward blocking voltage decreases and the forward current increases. The turn-on time of the body 10, defined as the time measured at 90 percent forward load current after the gate pulse is applied, is also dependent on the spreading velocity, and is easier to determine than the *di/dt* rating. The dynamic forward voltage drop measured at 10 microseconds after application of the gate pulse gives a better indication of the spreading of turn-on than the turn-on time. It has been found that removal of shunts within the first approximate 15 mil distance of the emitter edge immediately adjacent to the gate contact 40 lowers the dynamic forward voltage as well as minimizing the loop effect, *l*, in the forward I–V characteristic. This reduces the initial surge of heat generated when the device is turned on.

At low current levels and a high voltage, the shunts shorting the p-n junction 30, in accordance with the preferred shunt geometry, bypass the current thereby reducing the emitter injection efficiency. At higher current levels the voltage drop in the first base region 16 between shunts, or apertures 34, of the NPN transistor like portion of the body 10 will bias the emitter junction 30 sufficiently to cause minority carrier injection. By increasing the shorted emitter area, the distance between adjacent shunts decreases and the rate of rise of the forward blocking voltage increases. With an increase in the area of the shunts contacts by the emitter contact 38, the emitter area is decreased with a result that the current density is increased and the forward voltage drop is also increased.

During reverse recovery of the body 10, the emitter junction 30 and the anode junction 24 are reversed biased and the minority carriers within one diffusion length from these p-n junctions 30 and 24 are swept out from the base regions 16 and 20. During reverse biasing of the body 10, the shunt areas, or apertures 34, serve as sinks for minority carriers. The result of this is that the reverse recovery time is directly proportional to the area of the shunts, or apertures 34.

As a result of these findings the preferred geometry of a shorted-cathode-emitter design is as shown in FIG. 4. Semiconductor devices embodying the teachings of this invention, including the preferred geometrical design, have a lower turn-on time and a lower forward voltage drop than prior art devices. Additionally the *dv/dt* rating, or rate of rise of forward blocking is also lower than that for prior art devices but it is still reasonably high. Consequently high voltage, high current, fast turn-on all diffused controlled rectifiers fabricated in accordance with the teachings of this invention, function considerably better than prior art devices.

The body 10 as shown in FIG. 3 has a mesa type structure. Alternately, a semiconductor device having a planar type structure may also be made in accordance with the teachings of this invention. With reference to FIG. 6 there is shown a semiconductor device 50 made in accordance with the teachings of this invention.

The device 50 is comprised of the same materials, has the same functions, and is processed in the same manner, as the body 10 except for the first emitter region. Therefore, the device 50 comprises four successive regions 52, 54, 56, and 58 of alternate semiconductivity type providing a npnp structure. Between the continuous regions of opposite type semiconductivity, pn junctions 60, 62, and 64 are formed. The four succesive regions 52, 54, 56, and 58 are again respectively known as the first emitter region 52, the first base region 54, the second base region 56, and the second emitter region 58. The first emitter region 52 is again the cathode and the second emitter region 58 is again the anode of the device 50.

An electrical contact 66, preferably of a material selected from the group comprising molybdenum, tungsten, tantalum and base alloys thereof, is affixed to the device 50 by a recrystallized p-type semiconductor region 68.

The first emitter region 52 is formed by any suitable means such, for example, as the employment of photolithographic techniques and a diffusion of an n-type impurity into the first base region 54. The composite of the regions 52 and 54 in the top surface 70 has the same geometrical pattern as shown in FIG. 4. Since the device 50 is shown, for illustrative purposes only, as a circular shaped device, an electrical contact 72, functioning as a gate contact, is affixed to the central portion of region 54 comprising a part of the top surface 70 of the device 50. An electrical contact 74 affixed to a selected portion of the remainder of the top surface 70 functions as an emitter contact and is affixed to both regions 52 and 54. The portions of the region 54 affixed to the contact 74 function as shunts, or shorting means between the emitter contact 74 and the first base region 54 bypassing the p-n junction 60.

The device 50 functions exactly like the body 10 and has the same forward I–V characteristic as shown in FIG. 5.

It is to be noted, of course, that the electrical contacts to the various regions may be made of either alloying means establishing recrystallized regions of suitable semiconductivity type, or they may be affixed to the regions by other suitable means not requiring alloying. Additionally the means for shorting the p-n junction between the first emitter region and the first base region may be accomplished by alloying. Therefore, it is to be further noted that the geometry of the shorted-emitter-cathode structure may be appropriately embodied into alloyed and alloyed-diffused controlled rectifiers.

While the present invention has been shown and described in a few forms only, it will be understood that various changes and modifications may be made without departing from the spirit and scope thereof.

I claim:

1. A semiconductor controlled rectifier comprising:
- (a) four semiconductor regions arranged in succession of which contiguous regions are of opposite semiconductivity type, said regions comprising a first emitter region, a first base region, a second base region, and a second emitter region;
- (b) a p-n junction between each pair of contiguous regions of said opposite semiconductivity types;
- (c) a first electrical contact electrically connected to said first base region;
- (d) a second electrical contact electrically connected to both said first emitter region and said first region, the distance between that portion of said first base region electrically connected to the second electrical contact and an edge of the second electrical contact closest to an edge of the first electrical contact being greater than 15 mils; and
- (e) a third electrical contact electrically connected to said second emitter region.

2. The semiconductor controlled rectifier of claim 4 in which:

the total area of the top surfaces of said plurality of spaced means for shorting the p-n junction between said first emitter region and said first base region is less than 20 percent of the top surface area of said first emitter region.

3. The semiconductor controlled rectifier of claim 2 in which:

each of the spaced plurality of means for shorting the p-n junction between said first emitter region and said first base region comprises a body of semiconductor material having the same type semiconductivity as said first base region.

4. The semiconductor controlled rectifier of claim 1 in which said first base region is electrically connected to said second electrical contact by a plurality of spaced means for shorting the p-n junction between said first emitter region and said first base region, each of said plurality of spaced means is greater than 10 mils distance from each other.

5. The semiconductor controlled rectifier of claim 2 in which:

each of the spaced plurality of means for shorting the p-n junction between said first emitter region and said first base region comprises an aperture formed in, and extending entirely through, said first emitter region, exposing therefore a portion of said first base region to which said second electrical contact is electrically connected.

References Cited

UNITED STATES PATENTS

| | | | |
|---|---|---|---|
| 3,239,392 | 3/1966 | Sadler | 148—177 |
| 3,239,728 | 3/1966 | Aldrich et al. | 317—235 |
| 3,277,352 | 10/1966 | Hubner | 317—234 |
| 3,337,782 | 8/1967 | Todaro | 317—235 |
| 3,343,048 | 9/1967 | Kuehn et al. | 317—234 |

JOHN W. HUCKERT, Primary Examiner

ANDREW J. JAMES, Assistant Examiner

U.S. Cl. X.R.

317—234